(12) United States Patent
Pedmo et al.

(10) Patent No.: US 10,811,590 B1
(45) Date of Patent: Oct. 20, 2020

(54) CONTAINERS WITH SENSING AND/OR COMMUNICATION FEATURES

(71) Applicant: Plastipak Packaging, Inc., Plymouth, MI (US)

(72) Inventors: Marc A. Pedmo, Litchfield, MI (US); Kevin Darrah, Medina, OH (US)

(73) Assignee: Plastipak Packaging, Inc., Plymouth, MI (US)

( * ) Notice: Subject to any disclaimer, the term of this patent is extended or adjusted under 35 U.S.C. 154(b) by 188 days.

(21) Appl. No.: 15/631,388

(22) Filed: Jun. 23, 2017

Related U.S. Application Data (60) Provisional application No. 62/376,574, filed on Aug. 18, 2016, provisional application No. 62/353,694, filed on Jun. 23, 2016.

(51) Int. Cl.
| | |
|---|---|
| *H01L 41/00* | (2013.01) |
| *H01L 41/08* | (2006.01) |
| *H01L 41/113* | (2006.01) |
| *H04R 17/00* | (2006.01) |
| *H01L 41/083* | (2006.01) |
| H01L 41/27 | (2013.01) |
| H04R 17/02 | (2006.01) |

(52) U.S. Cl.
CPC ........ *H01L 41/0825* (2013.01); *H01L 41/083* (2013.01); *H01L 41/1132* (2013.01); *H04R 17/005* (2013.01); *B65D 2203/12* (2013.01); *H01L 41/27* (2013.01); *H04Q 2209/47* (2013.01); *H04R 17/025* (2013.01)

(58) Field of Classification Search
CPC ............... H01L 41/0825; H01L 41/083; H01L 41/1132; H01L 41/27; H04R 17/005; H04R 17/025; H04Q 2209/47; B65D 2203/12; Y10T 29/42; Y10T 29/4908; Y10T 29/4913; Y10T 29/49146; A47L 15/4229
USPC ........................................ 29/25.38, 832, 841
See application file for complete search history.

(56) References Cited

U.S. PATENT DOCUMENTS

| | | | |
|---|---|---|---|
| 4,507,583 A | | 3/1985 | Jensen et al. |
| 4,565,942 A | | 1/1986 | Sakai et al. |
| 4,602,989 A | | 7/1986 | Culkin |
| 5,053,671 A | | 10/1991 | Kobayashi et al. |
| 5,586,085 A | * | 12/1996 | Lichte .................. G01F 23/2962 367/165 |
| 6,186,005 B1 | | 2/2001 | Leidl |
| 6,236,322 B1 | | 5/2001 | Lopatin et al. |
| 6,527,958 B1 | * | 3/2003 | Carli .................... A47L 15/4229 210/104 |
| 6,588,269 B1 | | 7/2003 | Benghezal et al. |
| 6,895,815 B2 | | 5/2005 | Adgie et al. |
| 7,114,390 B2 | * | 10/2006 | Lizon .................. G01F 23/2961 73/290 V |

(Continued)

FOREIGN PATENT DOCUMENTS

| | | |
|---|---|---|
| DE | 20319718 U1 | 4/2004 |
| EP | 0060217 A1 | 9/1982 |

(Continued)

*Primary Examiner* — Donghai D Nguyen
(74) *Attorney, Agent, or Firm* — Fishman Stewart PLLC (57) ABSTRACT

A plastic container with a sensing or communication feature includes a sensor. In an embodiment, the sensor may include a piezo electric disc. The sensor may be connected to a surface of the plastic container or may be at least partially embedded within a wall of the plastic container.

15 Claims, 7 Drawing Sheets

(56) References Cited

U.S. PATENT DOCUMENTS

| | | | |
|---|---|---|---|
| 7,165,298 B2 | 1/2007 | Ehlers et al. | |
| 7,188,520 B2 | 3/2007 | Usui et al. | |
| 7,193,514 B2 | 3/2007 | Ritson | |
| 7,403,127 B2 | 7/2008 | Pfeiffer | |
| 7,515,507 B2 * | 4/2009 | Nanda | B65D 41/34 215/230 |
| 7,550,904 B2 | 6/2009 | Kawakubo et al. | |
| 7,576,470 B2 | 8/2009 | Kumar et al. | |
| 7,694,570 B1 | 4/2010 | Dam et al. | |
| 7,743,659 B2 | 6/2010 | Kearns et al. | |
| 7,805,991 B2 | 10/2010 | Usui et al. | |
| 8,156,792 B2 | 4/2012 | Berger et al. | |
| 8,174,166 B1 | 5/2012 | Hughes et al. | |
| 8,220,584 B2 | 7/2012 | Haynes et al. | |
| 8,448,509 B2 | 5/2013 | Elofsson et al. | |
| 9,106,205 B2 | 8/2015 | Gallagher et al. | |
| 9,196,964 B2 | 11/2015 | Baringer | |
| 9,222,825 B2 | 12/2015 | Lienenkamp | |
| 2008/0019217 A1 | 1/2008 | Gluszyk | |
| 2010/0163731 A1 * | 7/2010 | Haran | G08B 13/06 250/340 |
| 2012/0223833 A1 | 9/2012 | Thomas et al. | |
| 2014/0224019 A1 | 8/2014 | Brouillette et al. | |
| 2015/0020585 A1 | 1/2015 | Dussinger et al. | |
| 2016/0103219 A1 | 4/2016 | Elian et al. | |
| 2016/0146659 A1 | 5/2016 | Saltzgiver et al. | |
| 2016/0163175 A1 | 6/2016 | Jenkins | |
| 2016/0166096 A1 | 6/2016 | DiMaria-Ghalili et al. | |
| 2016/0211826 A1 | 7/2016 | Abdolvand et al. | |

FOREIGN PATENT DOCUMENTS

| | | |
|---|---|---|
| EP | 1172236 A2 | 1/2002 |
| GB | 2313473 A | 11/1997 |
| JP | S60-4820 A | 1/1985 |
| JP | 2008232801 A | 10/2008 |
| KR | 2002-0088012 A | 11/2002 |
| WO | WO-2012/123344 A1 | 9/2012 |

* cited by examiner

CONTAINERS WITH SENSING AND/OR COMMUNICATION FEATURES

CROSS-REFERENCE TO RELATED APPLICATIONS

This application claims the benefit of U.S. Provisional Patent Application Ser. No. 62/353,694, filed on Jun. 23, 2016 and U.S. Provisional Patent Application Ser. No. 62/376,574, filed on Aug. 18, 2016, the disclosures of which are hereby incorporated herein by reference in their entireties.

TECHNICAL FIELD

The present disclosure relates generally to plastic containers, including plastic containers having a sensor, such as a piezo electric disc, with or involving a sensing and/or communication feature.

BACKGROUND

Various types of plastic containers are known in the art.

Among other things, it can be desirable to provide plastic containers that include a sensor, and/or various sensing and/or communication features.

SUMMARY

A plastic container with a sensing or communication feature may include a sensor. In embodiments the sensor may include a piezo electric disc. In embodiments, a piezo electric disc may be connected to a surface of the plastic container or may be at least partially embedded within a wall of the plastic container.

Various aspects of the present disclosure will become apparent to those skilled in the art from the following detailed description of the various embodiments, when read in light of the accompanying drawings.

BRIEF DESCRIPTION OF THE DRAWINGS

Embodiments of the present disclosure may be described, by way of example, with reference to included representations and drawings.

DETAILED DESCRIPTION

Reference will now be made in detail to embodiments of the present disclosure, examples of which may be described herein and illustrated in the included representations and drawings. While the invention will be described in conjunction with embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
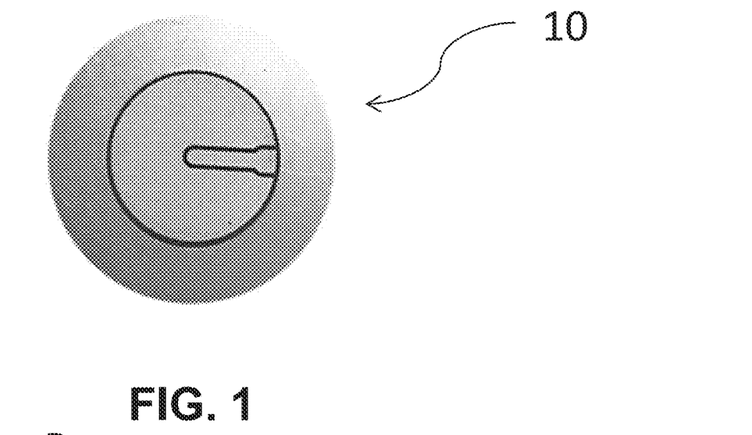
FIG. 1 generally illustrates an embodiment of a piezo electric disc in accordance with aspects or teachings of the present disclosure.

Embodiments of the present disclosure involve the use of a sensor (or sensing electrical feature), such as for example and without limitation, a piezo electric disc. In an embodiment, for example and without limitation, a sensor may include a piezo electric disc, such as the type that can be used with musical greeting cards. For example, and without limitation, a piezo electric disc 10 may appear as generally illustrated in FIG. 1.

In an embodiment, a sensor, such as a piezo electric disc, may be connected or attached to a side of a plastic container. The piezo electric disc may be connected to a surface of the plastic container (e.g., an outer surface) or, for some embodiments, may be partially or fully embedded within a wall of the plastic container. For example, material may be molded or otherwise provided or formed around all or a portion of the piezo electric disc.

An electrical pulse may be sent to/through a sensor, such as a piezo electric disc. For some embodiments/applications one such pulse may be all that is applied or needed. In applications, a piezo electric effect can work in two ways/directions, as a sound wave may be reflected back, and such a sound wave may be observed. An aspect of the concept, involves observation/measurement of liquid held within a container based on a reflection associated with a sensor, such as a piezo electric disc.

Figure 2:
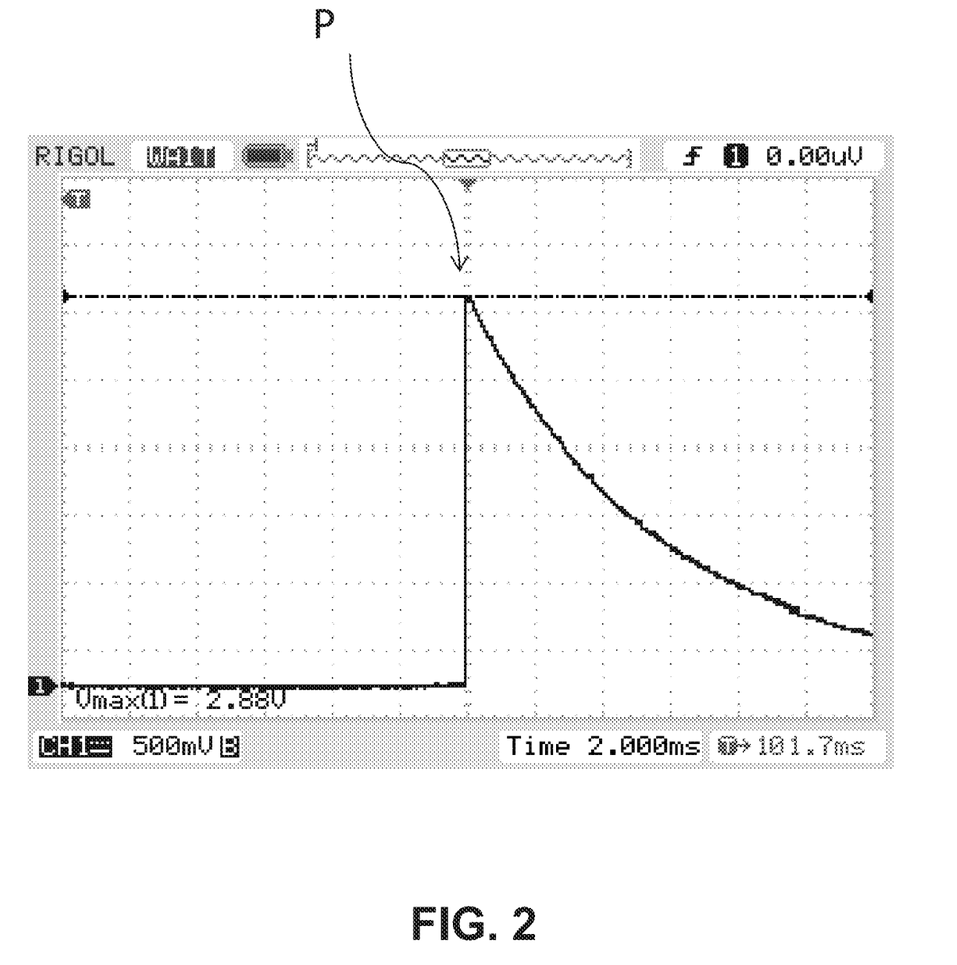
FIG. 2 is graphical graph/plot representation associated with an oscilloscope.

That is, in embodiments, a definite change in a reflected wave may be observed, such as for example, in connection with an oscilloscope. FIG. 2 generally illustrates a graphical graph/plot representation of what an observable pulse P might look like.

It is particularly noted that a more detailed look at the information may yield very useful information.

Figure 3:
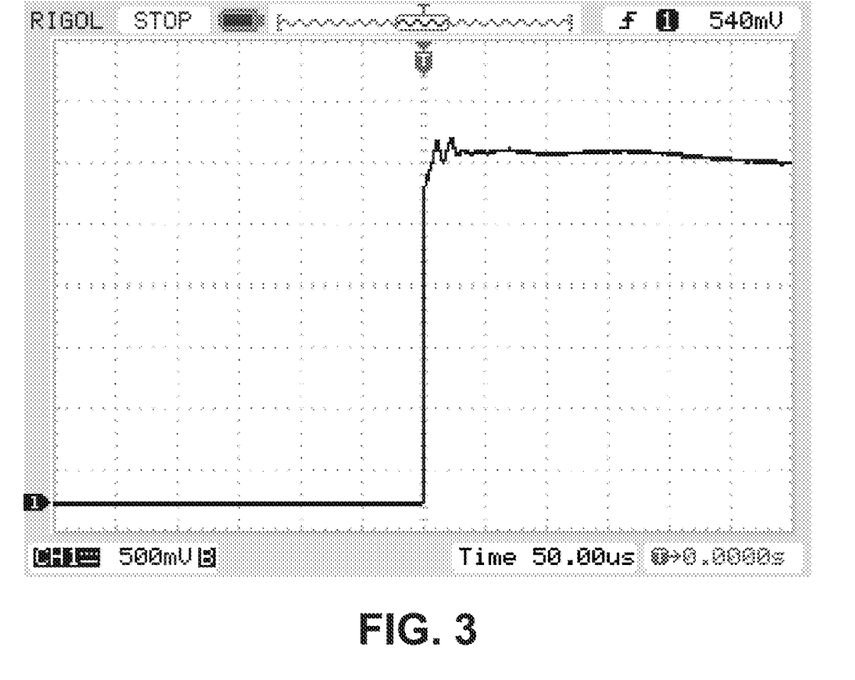
FIG. 3 is another graphical graph/plot representation associated with an oscilloscope.
Figure 4:
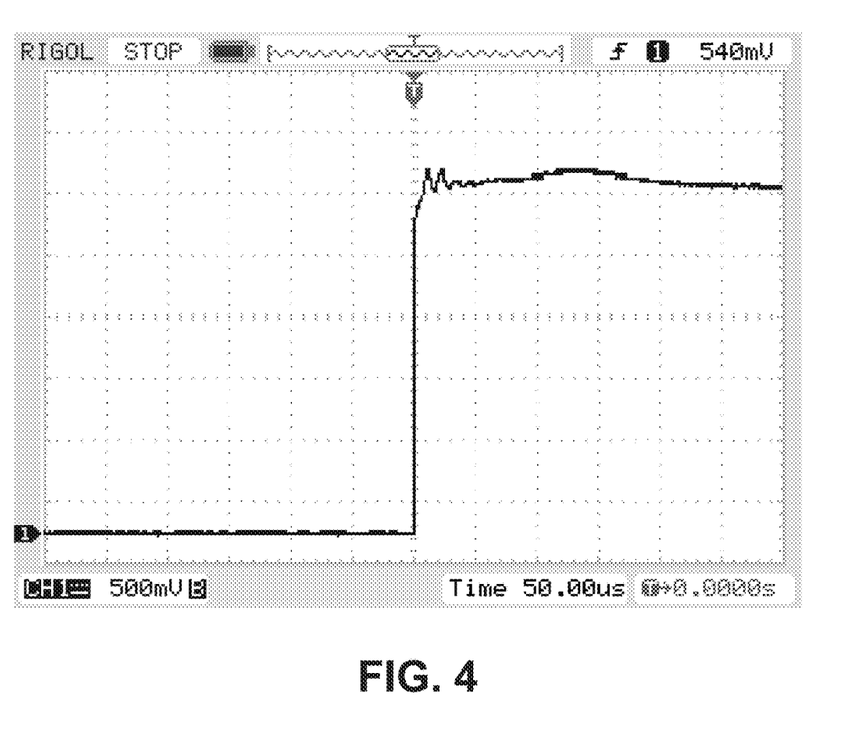
FIG. 4 is another graphical graph/plot representation associated with an oscilloscope.

For example and without limitation, FIG. 3 generally illustrates a graph/plot that may occur if a liquid content of a plastic container is disposed above an attached sensor/disc. In contrast, the graph/plot shown in FIG. 4 generally illustrates a plot that may occur when the liquid content of a plastic container is below an attached sensor/disc.

With respect to the aforementioned graphs/plots, a differential may be observed. That is, with respect to the example generally illustrated with respect to FIG. 4, a 100 mV difference can be observed or identified.

With embodiments of the concept/system, a processor may be included. The process can, among other things, help to fine-tune the system/circuit. In an embodiment, an Op-Amp Buffer may be added to allow for high impedance measuring of a reflected waveform. However, the concept is not limited to such measurement, and other devices/methods may be used for various applications.

It is noted that raw analog readings, and trends thereof, associated may be processed. Such information can be used to determine various empty/full thresholds for various containers and conditions. A variety of test methodologies may be employed. With an exemplary method, a frequency was swept to detect mechanical resistance of the container. In an embodiment, software code may be created that applies to such aforementioned thresholds. In an embodiment, code may turn on (or off) an LED based on the readings/results obtained.

Figure 5:
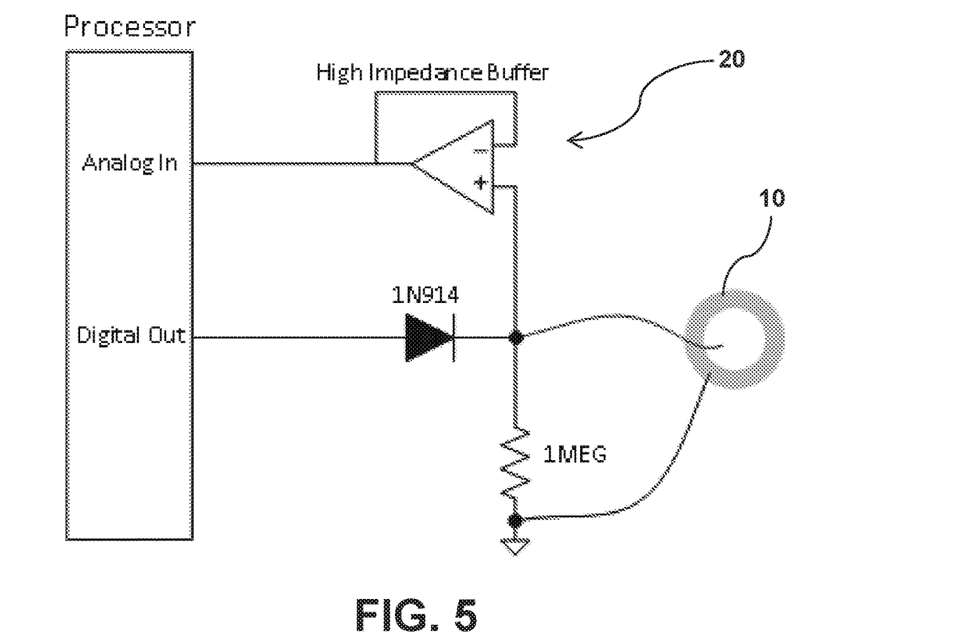
FIG. 5 generally illustrates an embodiment of test circuit in accordance with aspects or teachings of the present disclosure.

An embodiment of test circuit 20 is generally illustrated in FIG. 5.

Figure 6:
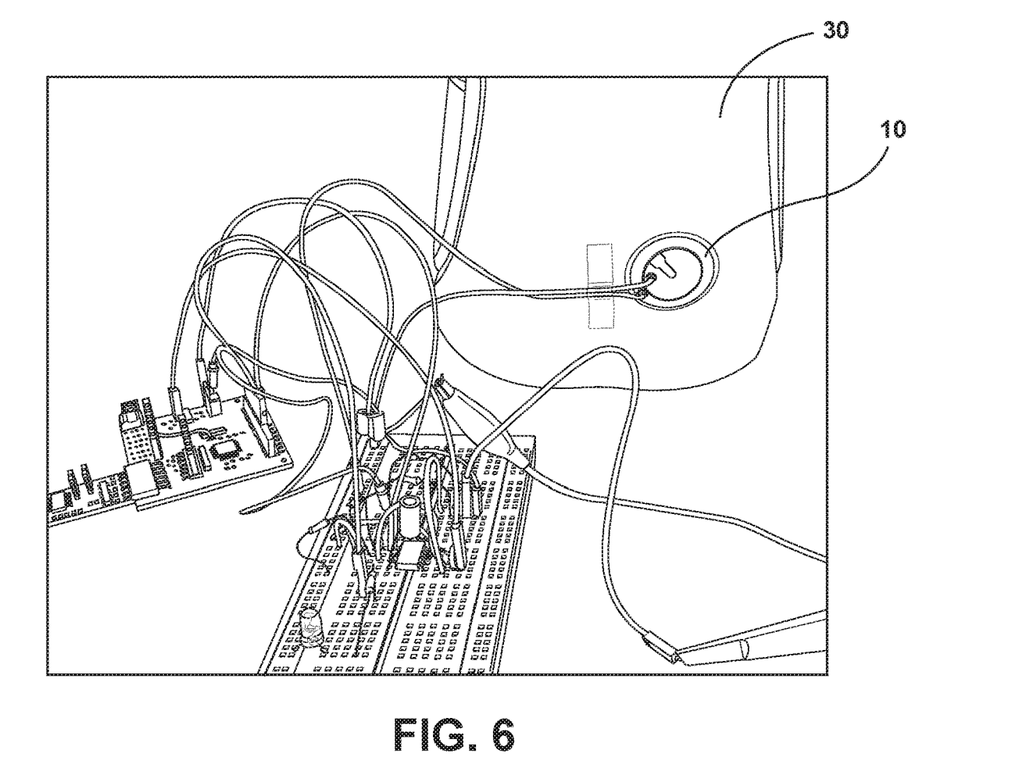
FIG. 6 generally illustrates a piezo electric disc attached to a container.

As generally depicted in FIG. 6, a piezo electric disc 10 is shown attached to a bottle 30, in this instance, an HDPE container.

Figure 7:
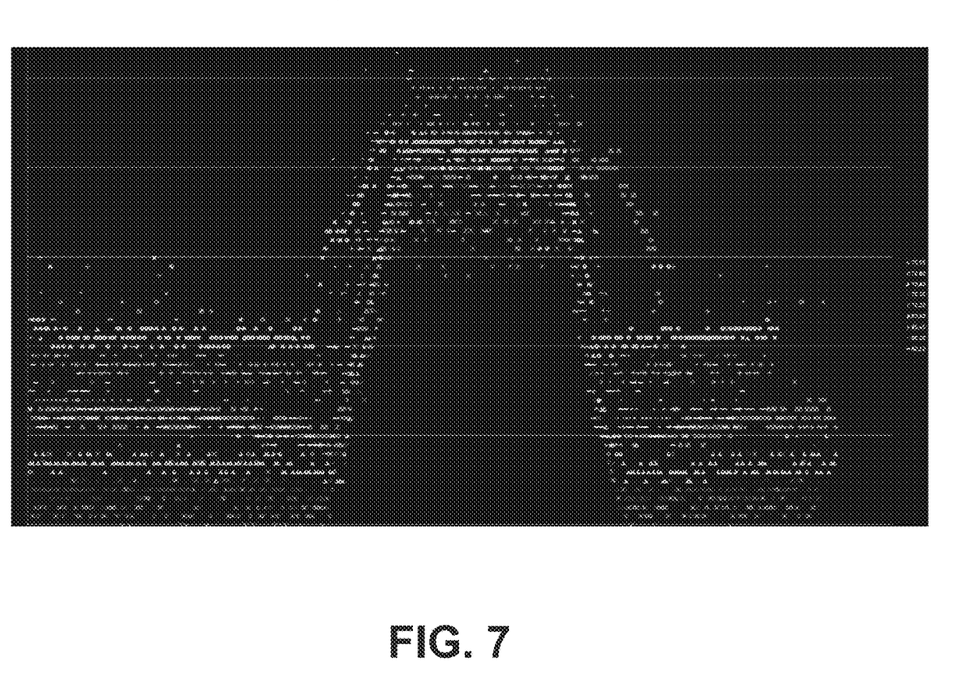
FIG. 7 is plot illustrating a plurality of data points or pixels.

With reference to the plot illustrated in FIG. 7, which may comprise a plurality of data points or pixels that may have different colors, it is noted that it can be desirable to take analog measurements at an appropriate time, which may be near the peak of a reflected waveform. Various testing may be conducted to fine-time, or best ascertain, an acceptable timing of pulse width and measurement delay.

Figure 8:
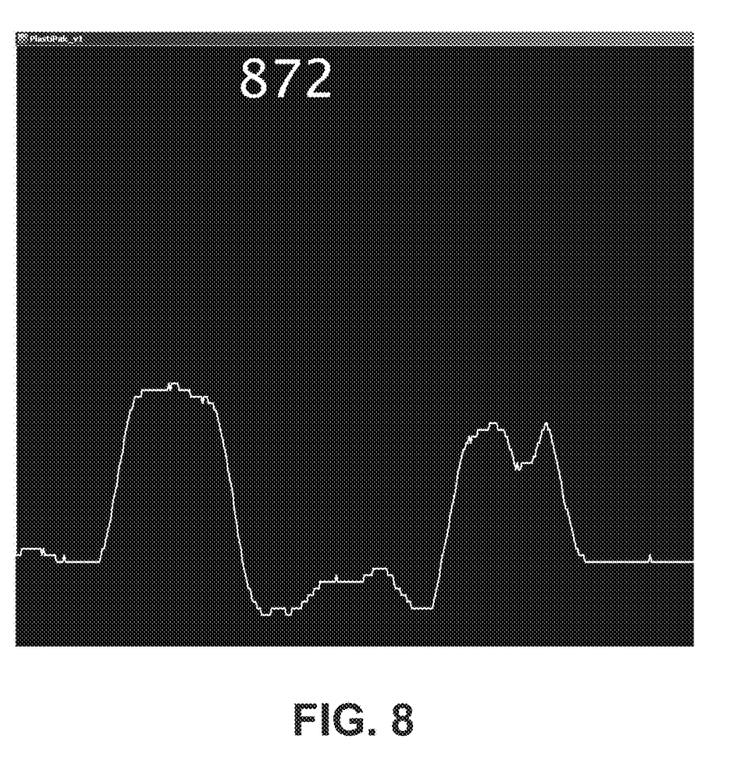
FIG. 8 is a graph/plot that generally illustrates a stable measurement in a dynamic range.

With reference to the graph/plot illustrated in FIG. 8, it is noted that with embodiments a pulse width of 70 μs and a delay of 40 μs may provide a stable measurement as well as an acceptable dynamic range. An application may be provided to trend measurements in real-time.

Experimentation with embodiments (such as with the HDPE container noted above) confirmed that the concept can be used to measure the liquid level. In one version of the testing, all of the contents was removed and was then slowly re-filled while data was taken and trending of data was observed. Such a system was able to measure the analog level of liquid contents inside the container.

Figure 9:
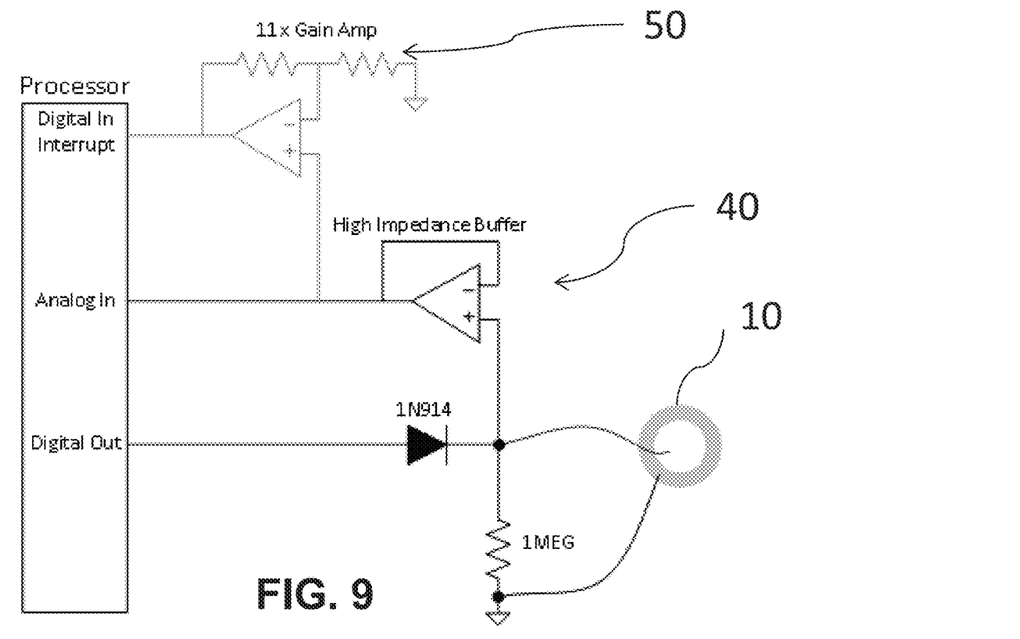
FIG. 9 generally illustrates an embodiment of a system that includes a second amplifier.

In embodiments, a system with a sensor, such as a piezo electric disc, may be configured such that a reflected wave can measure knocks. For example, a system can be configured to measure a certain number of knocks and to "wake" or activate certain electronics. With embodiments, the system may be configured to monitor an analog signal with a digital interrupt pin. However, in many instances, the associated signal amplitude may not be sufficiently high, that is, for example, the signal amplitude might be too low to trigger a high state. For some embodiments, the system 40 may be modified (such as generally illustrated in FIG. 9) to include a second amplifier 50. Among other things, such a second amplifier 50 can be used to "gain up" the signal to a sufficient or desired level.

Embodiments can involve a "smart cap" configuration. That is, when a bottle or container is opened, the opening associated with a cap can create a distinctive or identifiable sound. If the sound is one that can be observed or recognized using a piezo electric disc, then the occurrence of the opening can be observed or recognized by a system.

The disclosure involves various system embodiments. For example, with an embodiment of system, a container (e.g., a detergent container) may include a sensor, such as a piezo electric disc. A customer may purchase the container. The container can be configured to look to make contact with or interact with devices, such as phones. And, in embodiments, the container may "see" or interact with a customer's smart phone. The container could, for example, be in communication with a smart phone, and the container could note the date and time. With embodiments, the associated wireless technology may, for example and without limitation, include Bluetooth Low Energy (BLE), RFID, NFC, WiFi, LORA, proprietary ISM, or other compatible platforms or technologies. Therefore, while one or more such technologies are mentioned in connection with certain embodiments herein, the inventive concept is not so limited, and other communication technologies and platforms may also be utilized.

For example, in an embodiment, the system may be configured such that Bluetooth is used in the nature of a "beacon." Extremely low energy could be used. There may be no need to separately establish a connection, as the container may be set up to "broadcast" or "advertise" details—such as, for example and without limitation, container type, serial number, and fill level. Various devices—such as smartphones—can be configured to accept or "listen for" such broadcasts or advertisements. Such listening can be performed in the background, and notifications may be sent to a consumer/user when a beacon is within a certain range (e.g., 10 m).

In embodiments of the system, nothing may happen for a period of time. The container may, among other things, be seeking to ensure that a consumer/user has taken possession or ownership of the container (e.g., as opposed to merely being part of the distribution or retail network). When the container accepts that a consumer/user owns or possesses the container, a notification/message may be sent to the consumer's/user's phone. In embodiments, the consumer/user may be asked to affirmatively respond (e.g., respond "okay"). That may include situations in which it is not sufficiently certain that the consumer/user is the owner or possessor of the container. For example and without limitation, a consumer/user may be requested to "knock" on the container to confirm a situation or circumstance.

In embodiments, including those that potentially involve households with multiple smart phones, the system may be configured so that the application can support multiple devices. With "discovery" and "pairing," the container may communication with, e.g., share notices or adverting with, multiple devices.

With embodiments, once a container is associated with an account, pairing and communication can be maintained. A consumer/user may not need to affirmatively take any further action. In an embodiment, the content level associated with a container may be monitored—for example and without limitation, periodically (e.g., daily) and/or when the container experiences a "knock." When container contents are low, a container may transmit information to an application or device, such as a smart phone. Related information may be added (e.g., automatically) to shopping carts, coupons may be sent or applied, and/or other actions may come up or occur.

Embodiments of the system may be configured so that if a "connected" container is low, various responses may be taken. For example and without limitation, if a consumer/user is at or in the vicinity of a store, the consumer's/user's device (e.g., smart phone) my encounter (or "see") the relevant products/containers and, since it aware that the previously-acquired product/container at home is low, the consumer/user may be alerted. In embodiments, a smart phone's GPS information may be utilized—for example, to help determine where a consumer/user is at. In embodiments, a system can present or push relevant offers or coupons based on a sensed content level and/or a consumer's/user's physical location.

In an embodiment, the system can determine that the consumer/user ran out of a product and obtained more. An application might be configured so that a consumer/user may remove or delete the old/prior product. However, in embodiments, the application can observe that the old container was low, and a new container was obtained, and could automatically remove the item from a list (e.g., pantry list) or account. In embodiments, a consumer's/user's information may be stored in the cloud, and useful information (e.g., lists, coupons, promotions, recipes, and the like) can be intelligently sent to consumers/users. The cloud can also facilitate various product tracking and/or control. In situations in which a consumer/user switches brands or stops buying an item, the system may be configured to, upon certain circumstances, to assume that the item has been discarded or intentionally eliminated, and may remove the item from a list or account.

It is noted that various sensors, such as piezo electric discs, may be used and/or evaluated. Moreover, various positioning, or placement, may be envisioned—e.g., on sidewall, bottom, cap, etc. Further, various other sensing technologies may be included or contemplated including, without limitation, mechanical diaphragm, ultrasonic, Bluetooth integration, etc. Additional embodiments may include various uses of flexible PCB.

In an embodiment, a piezo electric assembly may, for example and without limitation, comprise a piezo electric disc (e.g., as 12 mm piezo disc), a battery (e.g., a 10 mm diameter battery, such as a CR1025 battery), and a circuit board (e.g., a round 10-12 mm diameter circuit board). The circuit board may, for example, contain a Bluetooth Low Energy (BLE) Radio (e.g., Nordic NRF51822) and supporting crystals, passive components, and RF related circuitry (Balun+Antenna). The BLE radio may also provide or facilitate piezo measurement functionality. Intermediate circuitry is not required, as the BLE Radio may connect directly to the piezo electric disc and may initiate or take a measurement at a specific interval.

The BLE radio may, for example, be configured as an iBeacon, as the communication may be one-way only. In an embodiment, the BLE radio may transmit at an advertisement interval. With an embodiment, when the BLE radio advertises, a smart communication device (e.g., a smart phone) that, for instance, includes an application that listens for communications (such as iBeacons with a specific UUID), can be alerted to run tasks. The application is not required to be in the foreground, in fact, with embodiments the smart communication device could be locked and stored (e.g., in the user's pocket), and the application may still receive the advertisement packet from the radio.

In an embodiment, an iBeacon packet may contain x4 bytes that are typically used for store ID's and product ID's. These may be fixed bytes (i.e., that do not change)—Major and Minor bytes. However, while iBeacon protocols may be used, it is noted that the concept is not so limited, and other protocols (e.g., Google's Eddystone) may also, or instead, be used. Moreover, the present concept allows for changing the Major and Minor bytes dynamically to, for example, pass sensor data to the application.

The circuit board may be able to extend battery life, as it can be configured to "sleep" in between advertisement intervals (e.g., 1-3 uA). When the circuit board "wakes up," the radio may be configured to pulse the piezo electric disc and, for instance, take x10 analog to digital readings (e.g., one after another). The circuit board may be configured to average readings, and apply an adjustment (e.g., a linear compensation adjustment). In an embodiment two major compensations may be included or utilized—a first compensation involving battery voltage, and a second compensation involving ambient temperature. For example, in an embodiment, a radio may determine whether there is liquid behind the piezo electric disc or not, and may flip a single bit in the advertisement packet. That bit may be one bit out of 32 bits, with the other 31 bits configured as a container identifier. The 31 bits could, for example, make up a number between 0 and 2,147,483,648. So as a circuit board is mounted to a container, the 31 bits could comprise a lot number, serial number, etc. So, when the radio advertises, a smart communication device could connect to "the Cloud" (e.g., a physical infrastructure of many computers, here the term is also intended to generically refer to a system with one or more computers), and report the 31 bits as well as the full/not-full bit. The Cloud could then, for instance, determine what the container is and/or other important information. Notably, when the smart communication device receives the advertisement, the user does not need to acknowledge this or be made aware of the communication in any way. That is, the application could be configured so that "in the background" it can report some or all advertisement packets to the Cloud automatically.

From reported data (e.g., data communicated to the Cloud), statistical analytics can be performed on the data to determine information, such as a user's ownership of containers. So for example, if a user walks by a container in the grocery store, the Cloud could see that action/item and log it as an event in connection with that user. If the Cloud continuously sees this container advertise over a period of a few hours or days, then the Cloud can with some degree of confidence (e.g., a high confidence at some level) add this product to a user's list of owned items. Further, as an example, if the cloud had already correlated this container with another user, then the information may suggest that a user is visiting others (such as friends/family). Also, if a container is indicated as logged to multiple users continuously, the information may tend to indicate that a container remains on a store shelf. Similar information may be associated with items that are thrown away or discarded. For example, the Cloud may see a product continuously in connection with a particular user and then may eventually see the product level go empty. Then, when the Cloud doesn't see the product anymore (or even sees an introduction of a new product or replacement), it may determine, again with some degree of confidence, that the initial product or item may be removed from the user's list. Moreover, notifications may be provided to users and/or others automatically based on the products owned, and their full/not-full status. For example, special grocery store beacons may be used, such that when the Cloud "sees" these beacons, tailored coupons for that store can be pushed to a smart communication device or otherwise presented.

Figure 10:
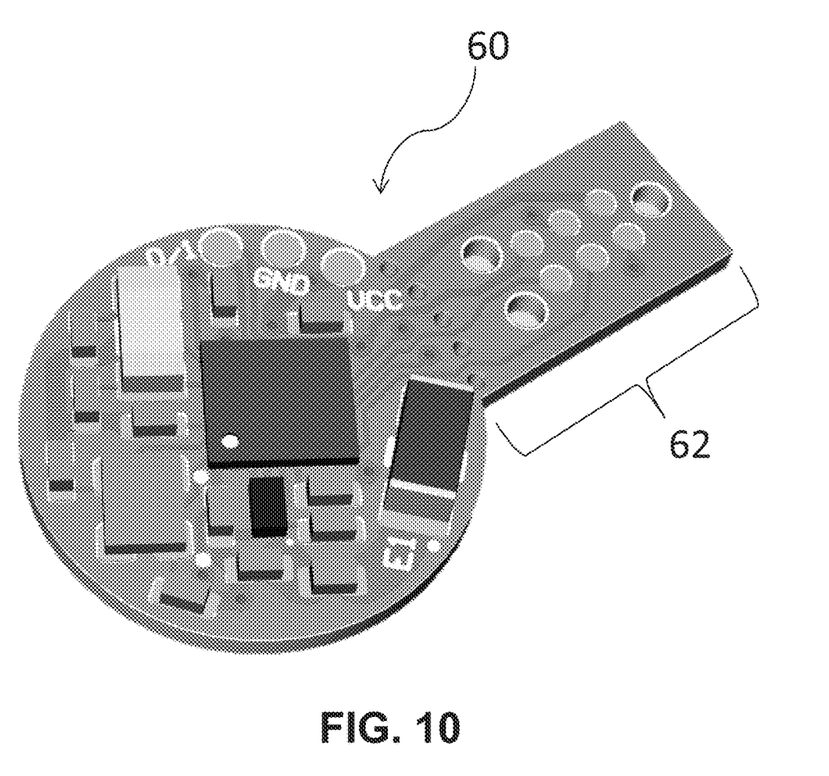
FIG. 10 generally illustrates an embodiment of a circuit board in accordance with aspects or teachings of the present disclosure.

By way of example and without limitation, FIG. 10 generally illustrates an embodiment of a circuit board 60.

It is noted that the part that extends from the circular portion of the circuit board (identified as portion 62) may be used for programming purposes, and then may be configured for removal (such as a breakaway tab).

As noted, embodiments of an assembly may include a piezo electric disc, a battery, and a circuit board. With embodiments, the piezo electric disc may be connected or mounted directly to a container, such as with an adhesive. A center portion of the piezo electric disc, which may be configured to receive pulses and/or measurements may connect up to a 0/1 connection on the circuit board—such as via a thin wire or ribbon cable(s). A portion (e.g., an outer brass portion) of the piezo electric disc may connect to ground. In embodiments, an insulator may be provided, followed by a battery. A positive terminal may be connected to a power pin on the circuit board (e.g., voltage at the common collector (VCC)). That is, in an embodiment, a 0/1 pin may connect the board to the piezo electric disc to facilitate pulsing and measuring. As the battery may be provided right on the circuit board, a negative (ground) terminal may, for example, make its connection directing with a conductive adhesive.

Figure 11:
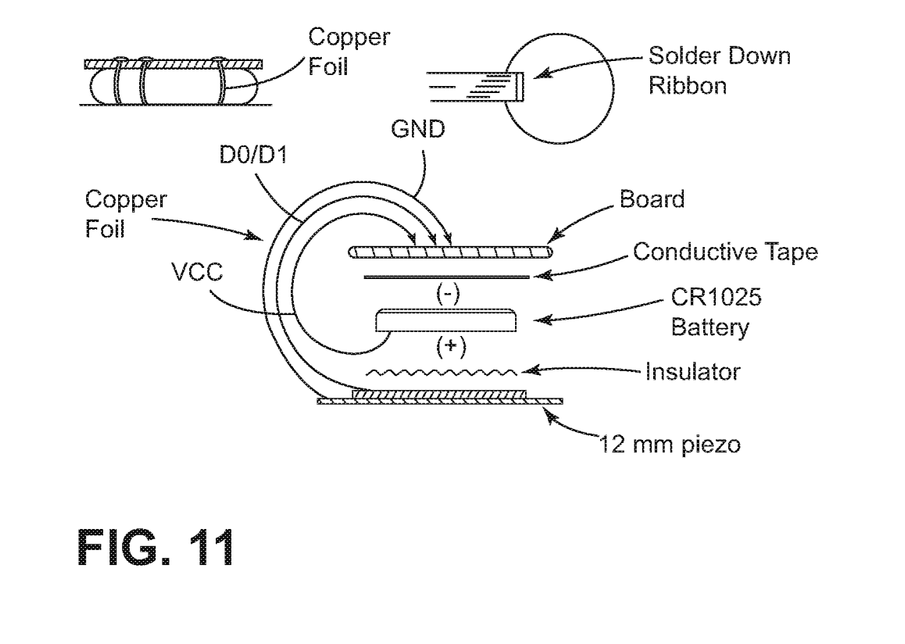
FIG. 11 generally illustrates and assembly with a piezo electric disc in accordance with aspects or teachings of the present disclosure.
Figure 12:
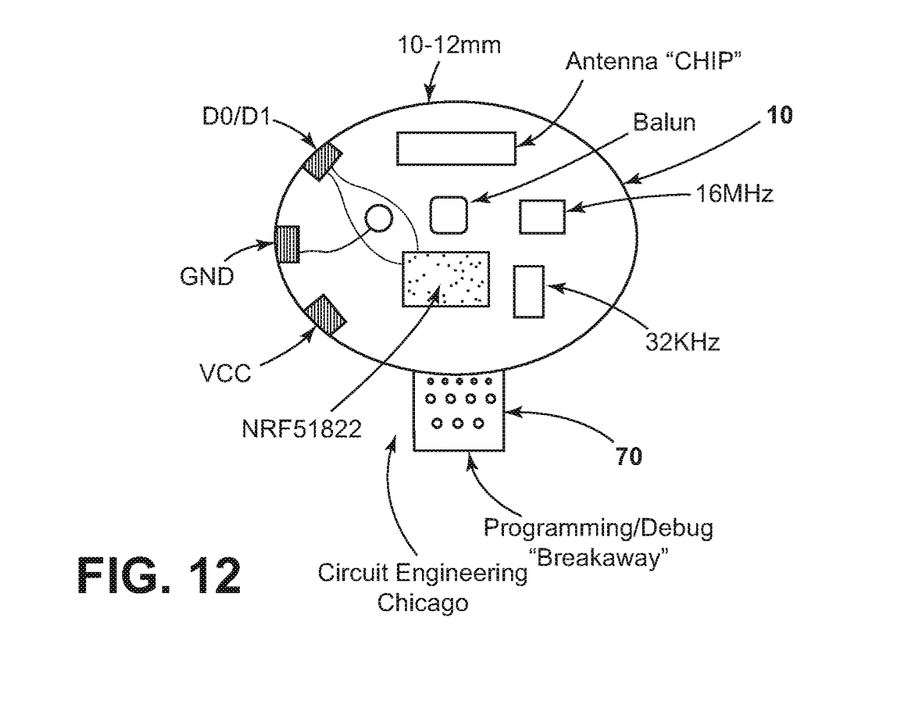
FIG. 12 generally illustrates a piezo electric disc that includes a break-away portion in accordance with aspects or teachings of the present disclosure.

FIG. 11 and FIG. 12 are sketches/illustrations demonstrating non-limiting aspects and features of an assembly with a disc and circuit board. For example and without limitation, FIG. 11 generally illustrates, inter alia, a battery (e.g., a CR1025 battery) in which a negative side of the battery is contacting or connected to a conductive material (e.g., conductive tape) that is disposed between at least a portion of the negative side of the battery and a board. The positive side (or opposing side) of the battery may be contacting or connected to an insulator, wherein the insulator may be provided between the battery and the piezo (e.g., piezo electric disc). In embodiments, a foil (e.g., copper foil) may be used to provide conductance. In an embodiment, as generally illustrated, a ribbon portion may be soldered down with respect to a disc. FIG. 12 generally illustrates, inter alia, a breakaway portion 70 that may be used to program and/or debug a disc 10, and which may be subsequently separated or removed.

Figure 13:
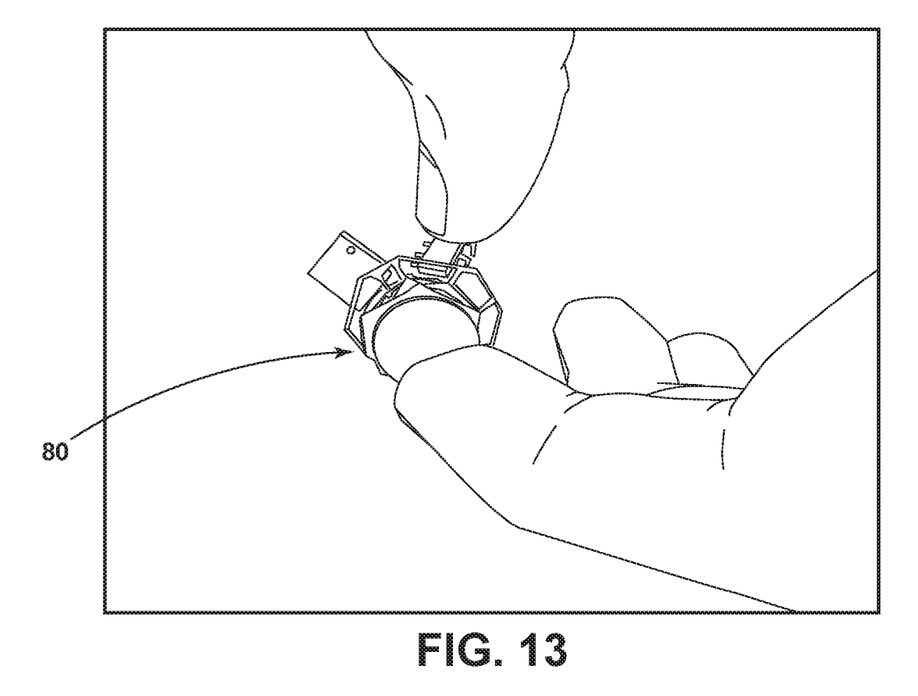
FIG. 13 is generally illustrates an embodiment of a circuit board in accordance with aspects or teachings of the present disclosure.
Figure 14:
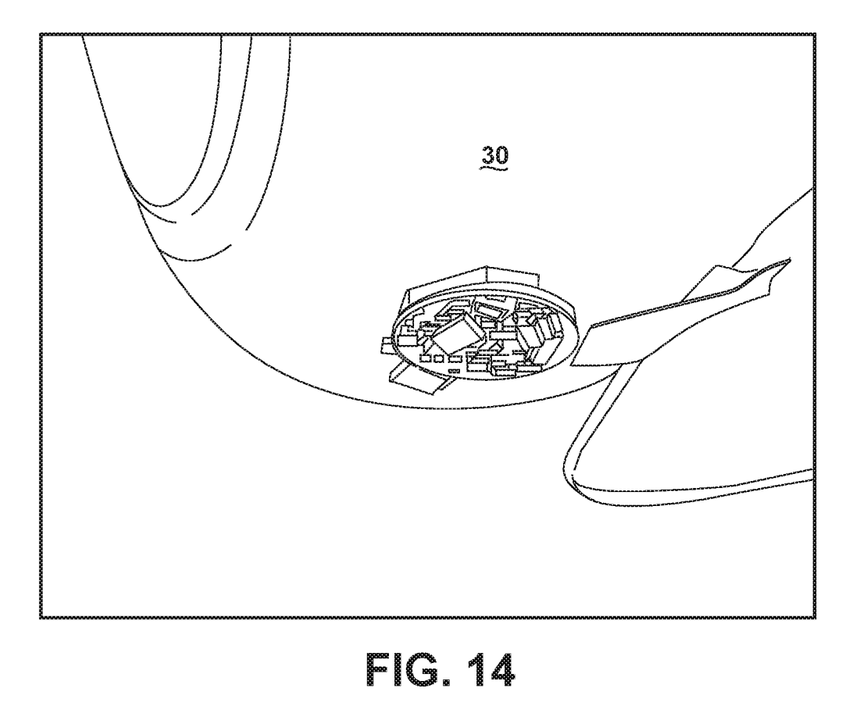
FIG. 14 generally illustrates an embodiment of a circuit board associated with a container being tested in accordance with aspects or teachings of the present disclosure.

FIG. 13 and FIG. 14 generally illustrate an embodiment of a circuit board 80 and a circuit board 80 associated with a container 30 that is being tested.

It is noted that various embodiments are described herein to various apparatuses, systems, and/or methods. Numerous specific details are set forth to provide an understanding of the overall structure, function, manufacture, and/or use of the embodiments as described in the specification and illustrated in accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "embodiments," "one embodiment," or "an embodiment," or the like, means that a particular feature, structure, or characteristic described in connection with the embodiment is included in at least one embodiment. Thus, appearances of the phrases "in various embodiments," "in embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Any joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. It is intended that all matter contained in the above description or shown in the accompanying drawings shall be interpreted as illustrative only and not limiting. Changes in detail or structure may be made without departing from the present disclosure.

Furthermore, the mixing and matching of features, elements and/or functions between various examples is expressly contemplated herein so that one of ordinary skill in the art would appreciate from this disclosure that features, elements and/or functions of one example may be incorporated into another example as appropriate, unless described otherwise, above. Moreover, many modifications may be made to adapt a particular situation or material to the teachings of the present disclosure without departing from the essential scope thereof. Therefore, it is intended that the present teachings not be limited to the particular examples illustrated by the drawings and described in the specification as the best mode presently contemplated for carrying out the teachings of the present disclosure, but that the scope of the present disclosure will include any embodiments falling within the foregoing description and the appended claims.

What is claimed is:

1. A plastic container with a sensing or communication feature comprising:
    a plastic sidewall;
    a sensor;
    wherein the plastic container comprises a plastic bottle; the sensor is at least partially embedded within the sidewall of the plastic bottle; and the sensor is configured to provide information pertaining to container contents without direct contact with such contents.

2. The plastic container of claim 1, wherein the sensor comprises a piezo electric disc.

3. The plastic container of claim 1, wherein the sensor is fully embedded within a wall of the plastic container.

4. The plastic container of claim 1, wherein plastic material is molded or formed around all or a portion of the sensor.

5. The plastic container of claim 1, wherein the sensor is configured to observe or measure a liquid held within the plastic container.

6. The plastic container of claim 5, wherein the sensor is configured to observe or measure a change in a reflected wave of the liquid.

7. The plastic container of claim 1, wherein the sensor is configured to provide information signifying that a liquid content of the plastic container is below the sensor.

8. The plastic container of claim 1, including a device to measure impedance associated with a reflected waveform.

9. The plastic container of claim 1, wherein the plastic container is comprised of HDPE.

10. The plastic container of claim 1, wherein the sensor is configured to measure knocks associated with a reflected wave of a liquid held within the plastic container; and the sensor is configured to activate at least one electrical component after the measuring of said knocks.

11. The plastic container of claim 1, including an amplifier configured to "gain up" a signal received by the sensor.

12. The plastic container of claim 1, wherein the sensor is configured to observe or recognize a sound or characteristic associated with opening the plastic container.

13. The plastic container of claim 1, wherein the plastic container is configured to attempt to make wireless contact with or interact with another device via a transmitter.

14. The plastic container of claim 13, wherein another device comprises a smart phone or computer network.

15. The plastic container of claim 1, including a circuit board; wherein the circuit board is connected to the sensor and a transmitter; and the sensor, the transmitter, and the circuit board are molded within a side-wall of the plastic container.

* * * * *